United States Patent
Kim et al.

(10) Patent No.: US 7,807,064 B2
(45) Date of Patent: Oct. 5, 2010

(54) HALOGEN-FREE AMORPHOUS CARBON MASK ETCH HAVING HIGH SELECTIVITY TO PHOTORESIST

(75) Inventors: Jong Mun Kim, San Jose, CA (US); Judy Wang, Cupertino, CA (US); Ajey M. Joshi, San Jose, CA (US); Jingbao Liu, Sunnyvale, CA (US); Bryan Y. Pu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 724 days.

(21) Appl. No.: 11/689,389

(22) Filed: Mar. 21, 2007

(65) Prior Publication Data
US 2008/0230511 A1     Sep. 25, 2008

(51) Int. Cl.
*B44C 1/22* (2006.01)
(52) U.S. Cl. .............. 216/40; 216/37; 216/58; 216/67; 216/89; 438/706; 438/710; 438/712; 438/745
(58) Field of Classification Search ............ 216/40, 216/37, 58, 67, 89; 438/706, 710, 712, 745
See application file for complete search history.

(56) References Cited
U.S. PATENT DOCUMENTS

| | | | |
|---|---|---|---|
| 6,326,307 B1 | 12/2001 | Lindley et al. | |
| 6,541,361 B2 | 4/2003 | Ko et al. | |
| 6,767,824 B2 * | 7/2004 | Nallan et al. | 438/633 |
| 6,900,123 B2 | 5/2005 | Jiang et al. | |
| 7,129,180 B2 * | 10/2006 | Sandhu et al. | 438/717 |
| 7,572,386 B2 * | 8/2009 | Ventzek et al. | 216/67 |
| 2005/0064719 A1 | 3/2005 | Liu et al. | |

OTHER PUBLICATIONS

Jean Tsong-shin et al. Journal of Photopolymer Science and Technology, vol. 14, (2001), pp. 503-506.*

* cited by examiner

*Primary Examiner*—Lan Vinh
*Assistant Examiner*—Maki A Angadi
(74) *Attorney, Agent, or Firm*—Blakely Sokoloff Taylor & Zafman, LLP (57) ABSTRACT

In one embodiment of the present invention, a halogen-free plasma etch processes is used to define a feature in a multi-layered masking stack including an amorphous carbon layer. In a particular embodiment, oxygen ($O_2$), nitrogen ($N_2$), and carbon monoxide (CO) are utilized to etch the amorphous carbon layer to form a mask capable of producing sub-100 nm features in a substrate film having a reduced line edge roughness value. In another embodiment, the present invention employs an $O_2$ plasma pretreatment preceding the halogen-free amorphous carbon etch to first form an oxidized silicon region in a patterned photoresist layer to increase the selectivity of the amorphous carbon etch relative to a patterned photoresist layer containing unoxidized silicon.

17 Claims, 5 Drawing Sheets

HALOGEN-FREE AMORPHOUS CARBON MASK ETCH HAVING HIGH SELECTIVITY TO PHOTORESIST

BACKGROUND

1. Field

The present invention relates to the electronics manufacturing industry and more particularly to the process of etching features in a multi-layered masking stack.

2. Discussion of Related Art

As the feature size of the device pattern gets smaller than 100 nm, the critical dimension (CD) requirement of features becomes a more important criterion for stable and repeatable device performance. Photoresist films must get thinner for better resolution at a given optical transparency, so sufficient etch resistance becomes more difficult to attain without a hard mask. Striations in the sidewalls of features are one of main sources of CD variation. Generally, striations are believed to initiate in the sidewalls of the mask and propagate downward into the substrate as it is etched to form a feature. Striations occur as a result of both the photolithographic process and the etch process. Initial line edge roughness (LER) roughness, caused by the diffusion of acids during develop can be exacerbated during etch. Striations are typically quantified with an LER measurement taken from a top down view of the feature. Furthermore, the mechanical softness, rough as-developed sidewalls, and reduced thickness of 193 nm ArF photoresist (PR) combine to make it difficult to etch a sub-100 nm feature without striations.

For a smaller LER value, it is necessary to use either a more etch resistant and/or thicker mask material, or improve the selectivity of the etch process. The former option increases the number of production steps, resulting in higher cost per wafer as well as complex integration issues. However, the latter option typically displays several etch process limitations, such as severe loading effects and even increased LER resulting from irregular polymer deposition which negatively impact CD control.

SUMMARY

In one embodiment of the present invention, a halogen-free plasma etch process is used to define a feature in a multi-layered masking stack including an amorphous carbon layer. In a particular embodiment, oxygen ($O_2$), nitrogen ($N_2$), and carbon monoxide (CO) are utilized to etch the amorphous carbon layer to form a mask capable of producing sub-100 nm features in a substrate film having a reduced line edge roughness value. In another embodiment, the present invention employs an $O_2$ plasma pretreatment preceding the halogen-free amorphous carbon etch to first form an oxidized silicon region in a patterned photoresist layer to increase the selectivity of the amorphous carbon etch relative to a patterned photoresist layer containing unoxidized silicon. In a further embodiment, the $O_2$ plasma pretreatment also patterns an organic anti-reflective coating formed over the amorphous carbon layer to form a multi-layered mask for etching sub-100 nm features in a dielectric film having a low line edge roughness value.

DETAILED DESCRIPTION

In various embodiments, novel substrate processing methods are described with reference to figures. However, various embodiments may be practiced without one or more of these specific details, or in combination with other known methods, materials, and apparatuses. In the following description, numerous specific details are set forth, such as specific materials, dimensions and processes parameters etc. in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 1:
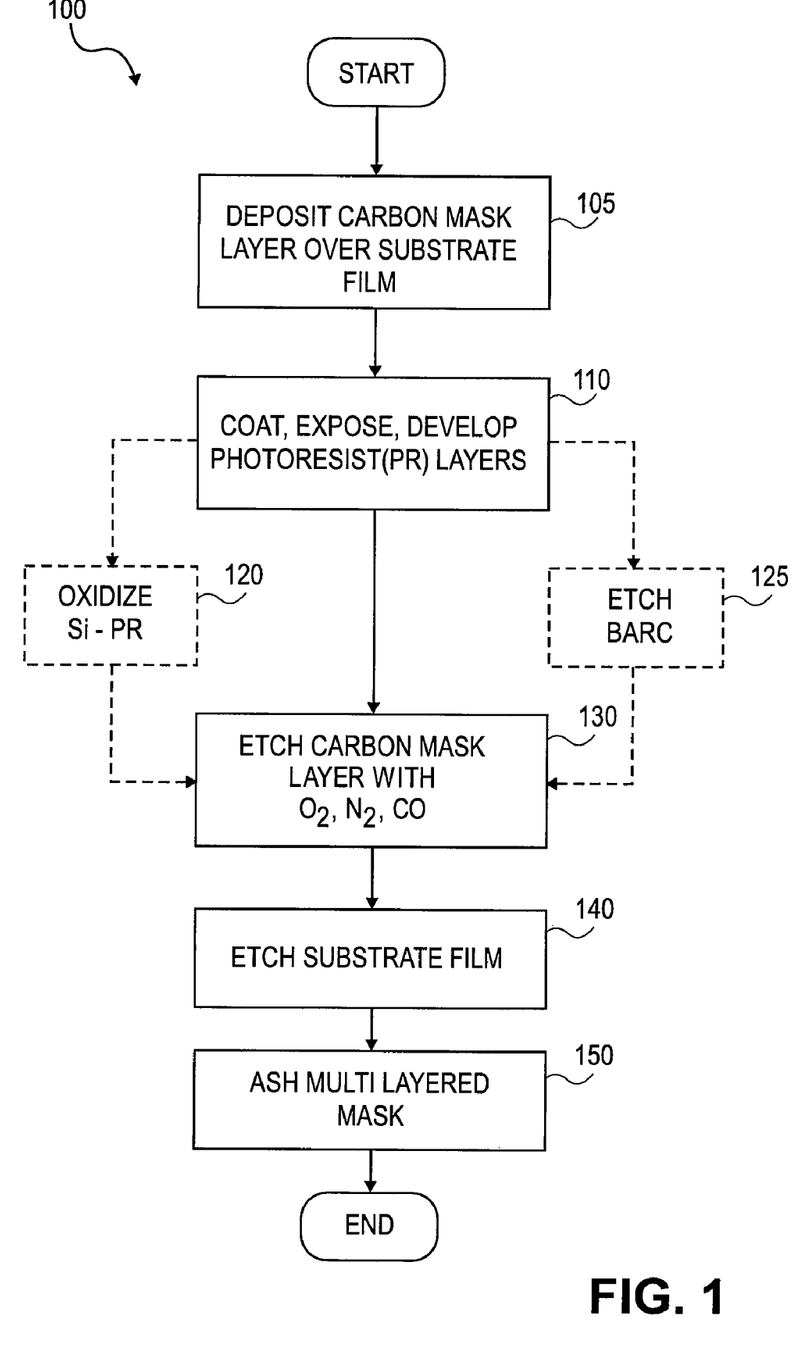
FIG. 1 is a flow chart depicting a method of etching a feature with a multi-layered mask in accordance with particular embodiments of the present invention.

FIG. 1 illustrates a flow chart of method 100 for etching a feature in accordance with an embodiment of the present invention. Method 100 is performed upon a substrate during the fabrication process. FIGS. 2A-2F illustrate cross-sectional views of a substrate having a feature fabricated in accordance with embodiments of the method illustrated in FIG. 1. FIG. 3 illustrates a plasma etch system 300 which is employed in embodiments of the present invention.

The method 100 of FIG. 1 starts with a substrate film 220 (FIG. 2A) on a support 210. In one embodiment, support 210 is a semiconductor wafer, such as, but not limited to silicon, germanium, or a commonly known III-V compound semiconductor material. In another embodiment, support 210 is a glass or sapphire material. The substrate film 220 generally comprises a dielectric layer. In one embodiment, the dielectric layer is a nitride film, while in another embodiment the dielectric layer is an oxide of silicon. It should be understood, however, that substrate film 220 may comprise multiple layers of various other materials commonly known in the art, such as, but not limited to, oxides of silicon, low-k materials, and metals.

In an embodiment, at operation 105, an amorphous carbon layer 225 is formed upon the substrate layer 220. An amorphous carbon material is available from Applied Materials, Inc., CA, U.S.A. under the trade name Advanced Patterning Film™ (APF). Amorphous carbon layer 225 forms the first layer of a multi-layered mask. Amorphous carbon layer 225 is not photosensitive and instead is defined with a plasma etch to reproduce with high fidelity the pattern of an overlying photosensitive layer. While amorphous carbon film 225 provides additional thickness to the mask much like a traditional hard mask (employing a nitride or oxide of silicon), it is advantageous because the amorphous carbon film 225 can be readily removed with the same methods used to remove a photosensitive layer, for example, an $O_2$ plasma ash. Thus, because no additional mask removal operations are required, process complexity is reduced relative to the traditional hard mask process. In one embodiment, the amorphous carbon layer is an inorganic carbon material formed to a thickness between 100 Å and 3000 Å using a PECVD process. In a particular embodiment, layer 225 is approximately 2000 Å thick to increase the total thickness of the mask over the substrate film 220 without requiring a photolithographic process to define the entire mask thickness. The amorphous carbon layer may also include nitrogen or other additives. Additionally, the amorphous carbon layer may be capped with an inorganic anti-reflective coating (ARC) layer (not shown), which is typically made of SiON.

Figure 2A:
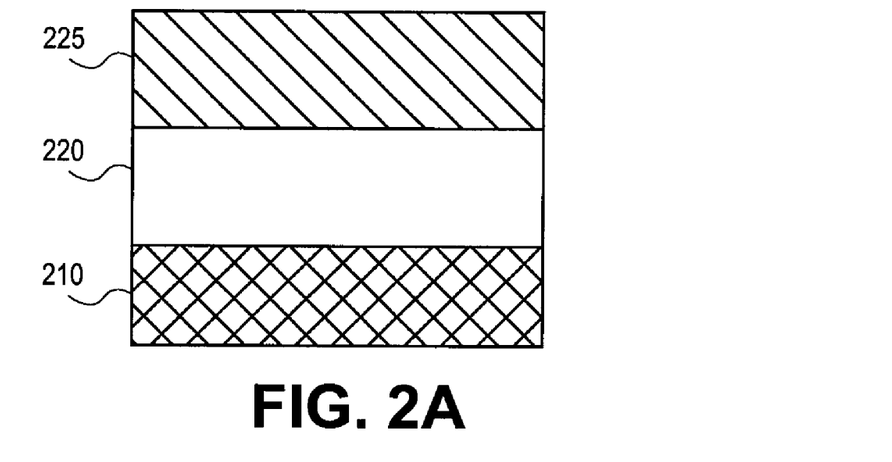
FIGS. 2A-2F are cross sectional illustrations of a method of etching features in a multi-layer mask in accordance with one embodiment of the present invention.
Figure 2B:
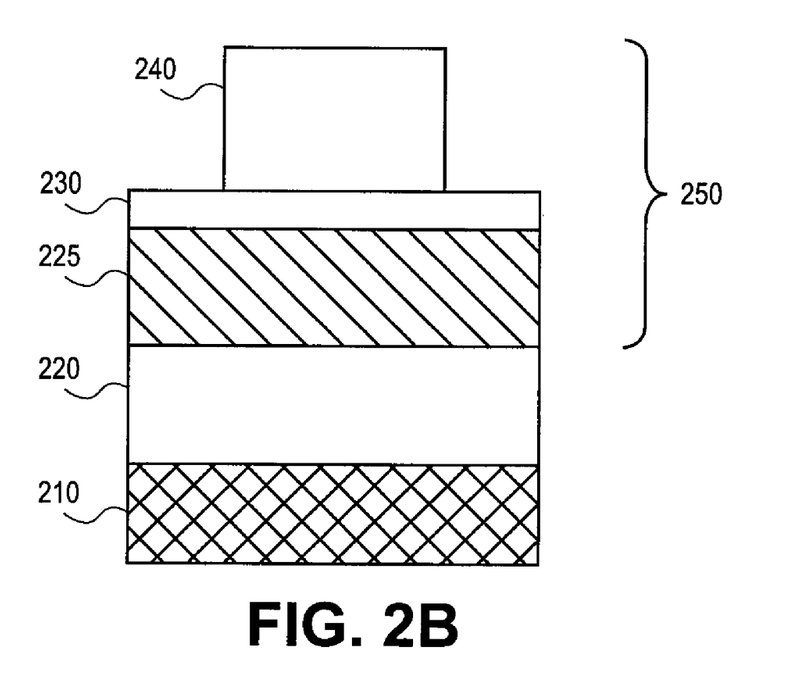
Figure 3:
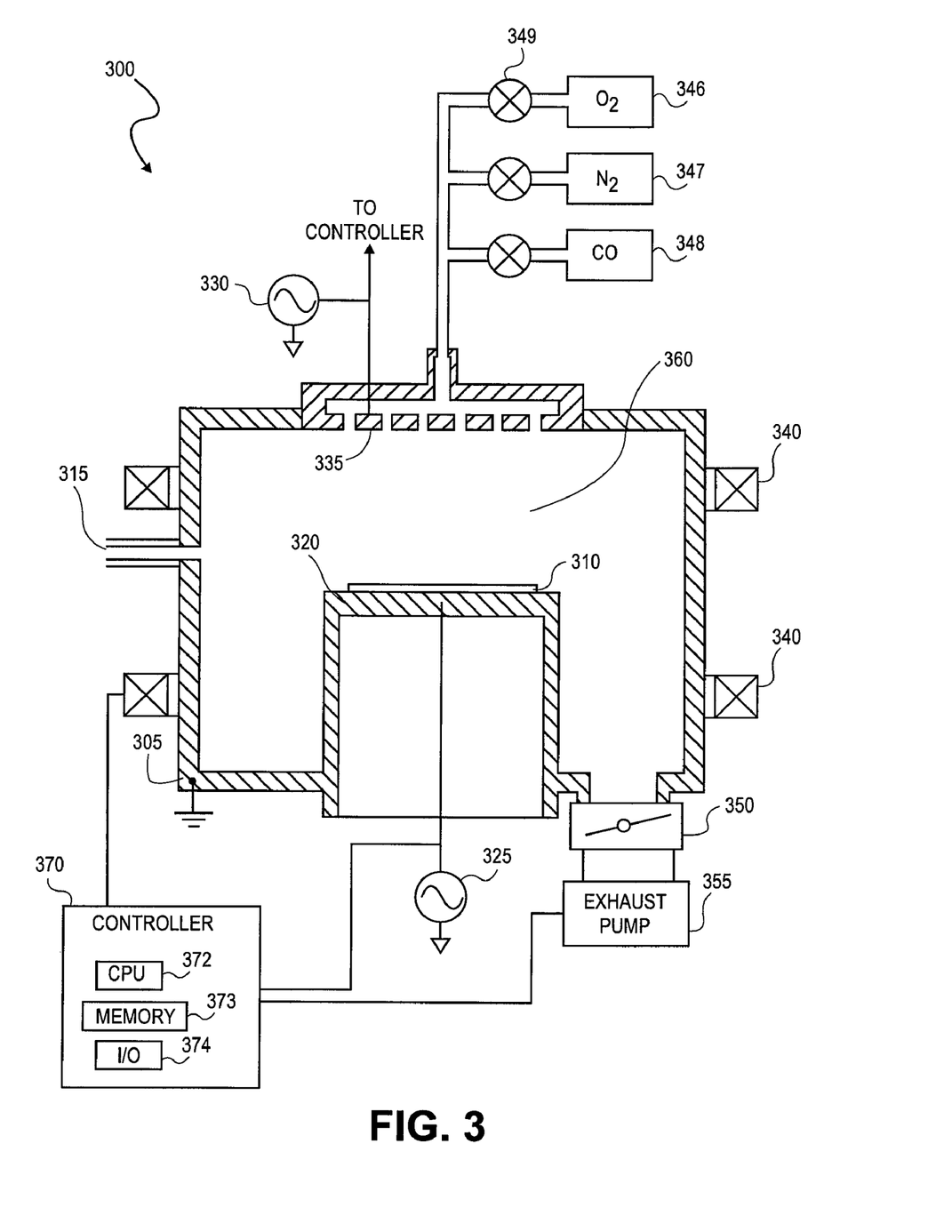
FIG. 3 is a cross-sectional illustration a plasma etch system for performing methods in accordance with one embodiment of the present invention.

FIG. 2B depicts a multi-layered mask 250 after photolithography operation 110 (FIG. 1). In one embodiment, during operation 110 a bottom anti-reflective coating (BARC) 230 is applied. The BARC 230 is used to reduce reflection of light during patterning of the photosensitive layer. BARC 230 is also useful for the thinner silicon-photoresist coatings because the BARC 230 increases the thickness of the masking film for improved etch resistance during etch of the substrate film 220. The BARC 230 is typically an organic material, such as, but not limited to polyamides and polysulfones. Generally, the minimum thickness of the BARC 230 is that required to extinguish the light used for exposure. For a 193 nm application, this thickness is on the order of 400 Å for various commonly known organic BARC formulations. It is usually unnecessary to have both BARC 230 as well as an ARC layer (not shown) over the amorphous carbon layer 225, but may nonetheless still be practiced.

During operation 110, a photosensitive layer (photoresist) is coated, exposed and developed using commonly known techniques to form patterned photoresist 240 over the amorphous carbon layer 225. In one embodiment (not shown), BARC 230 is not employed and patterned photoresist 240 is coated on the amorphous carbon layer 225 (or inorganic ARC). In another embodiment, as shown in FIG. 2B, patterned photoresist 240 is separated from the amorphous carbon layer 225 by BARC 230. Patterned photoresist 240 and BARC 230 form what is commonly referred to as a "bi-layer" resist. In one embodiment, patterned photoresist 240 forms a feature having a critical dimension below 100 nm. In a specific embodiment, patterned photoresist 240 forms a feature having a critical dimension between approximately 70 nm and 80 nm.

In an embodiment, patterned photoresist 240 is a conventional acrylate composition with a thickness between 2000 Å and 6000 Å. In an alternate embodiment, patterned photoresist 240 is siloxane and silsesquioxane (SSQ) based. In a particular embodiment, patterned photoresist 240 contains approximately 15% (atomic) silicon, such as JSR EBX™ series, available from JSR Micro Kyushu Co., Ltd. Kyushu, Japan. Another silicon photoresist is FujiFilm TIS-2000™, available from FUJIFILM Electronic Materials U.S.A., Inc. RI, U.S.A. In a further embodiment, patterned photoresist 240 containing silicon is between 1000 Å-2000 Å thick.

Thus, upon completion of operation 110 in FIG. 1, a multi-layer mask stack, including a layer of patterned photoresist 240 over an unpatterned amorphous carbon layer 225, is formed over the substrate film 220. In a further embodiment, as shown in FIG. 2B, multi-layer mask stack 250 includes an unpatterned organic BARC 230 separating a layer of patterned photoresist 240 from an unpatterned amorphous carbon layer 225.

Figure 2C:
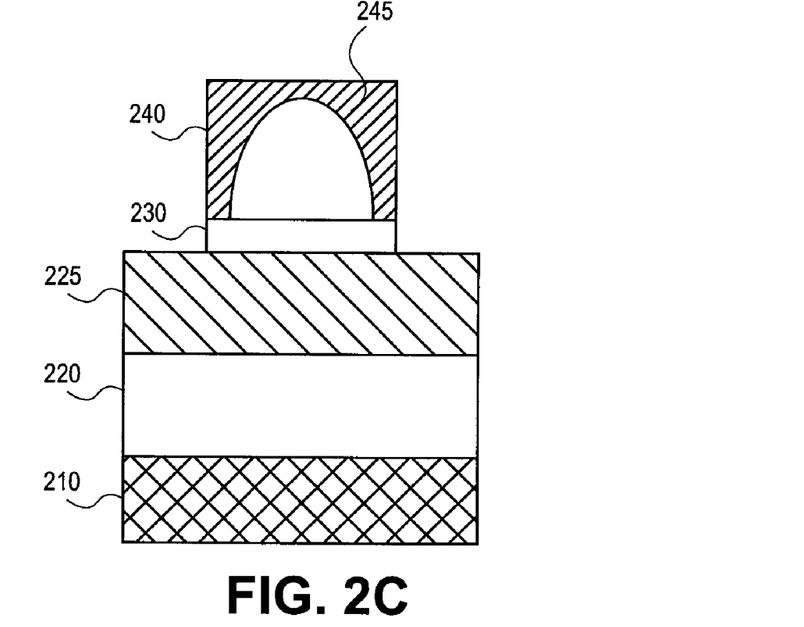

At operation 120, particular embodiments of the present invention include a plasma pretreatment of patterned photoresist 240 to oxidize or nitridize a portion of the silicon contained in the patterned photoresist 240 prior to defining the amorphous carbon layer 225. As shown in FIG. 2C, oxidization or nitridation of the photoresist silicon moiety forms modified photoresist 245 in patterned photoresist 240. Modified photoresist 245 has a lower etch rate than untreated patterned photoresist 240 during a subsequent etch of the amorphous carbon layer 225 with the method described in more detail below. This lower etch rate reduces line edge roughness in the amorphous carbon layer 225 and ultimately the substrate film 220. The lower etch rate of modified photoresist 245 increases the selectivity (S) of the subsequent etch of amorphous carbon layer 225. The selectivity (S), is defined as a ratio of the etch rate of the film to be etched over the etch rate of the masking film. In particular embodiments, discussed in more detail below, the selectivity (S) of the amorphous carbon etch to the modified photoresist 245 is between 10:1 and 100:1. The higher selectivity (S) allows the thickness of the amorphous carbon layer 225 in the multi-layer mask 250 to be increased relieving the constraints on the main etch of substrate film 220 and improving sidewall smoothness.

In one embodiment, modified photoresist 245 is formed by plasma oxidation of the silicon in patterned photoresist 240. Oxidation of the silicon moiety to form Si—O bonds is a mechanism which competes with the oxidation of the organic moiety in the photoresist. Conditions favoring the oxidation of the organic species cause the critical dimension of patterned photoresist 240 to shrink as in a typical photoresist trimming process without forming the beneficial modified photoresist 245. Under conditions favoring the oxidation of the silicon species in the photoresist, the critical dimension of the patterned photoresist 240 is reduced by a lesser amount while the thickness of the modified photoresist 245 is increased. This latter condition improves the etch selectivity (S) of the subsequent amorphous carbon layer 225 without unacceptable line critical dimension (CD) loss.

In an embodiment, $O_2$ flows above approximately 40-50 standard cubic centimeters per minute (sccm) are employed to cause less CD loss in patterned photoresist 240 than that incurred with flow rates below this threshold. Embodiments with $O_2$ flow above 40-50 sccm display a relatively constant amount of CD loss. In an embodiment, no additives, such as $N_2$ or CO, are introduced to the $O_2$ plasma because non-oxidizing additives impede the formation of the modified photoresist 245, causing the subsequent etch of the amorphous carbon layer 225 to have lower selectivity to the patterned photoresist 240. $N_2$ and CO additives are believed to dilute the oxidizing chemistry of the plasma as well as cause increased ion bombardment tending to sputter away the modified photoresist 245 and chamfer the corners of the patterned photoresist 240.

In a further embodiment, source powers above 200 W are employed. Source powers below the 200 W threshold are insufficient to oxidize the silicon in patterned photoresist 240 to form the modified photoresist 245. Therefore, source powers above this threshold result in a greater selectivity (S) improvement. In a further embodiment, bias powers between 50 W and 200 W are employed. Higher bias power also increases the amount of oxidation of patterned photoresist 240, but disadvantageously increases the loss of critical dimension (CD) of the patterned photoresist 240.

Thus, in certain embodiments, the oxygen plasma pretreatment is performed by introducing 40-500 sccm of $O_2$ energized with between 50 W and 200 W bias power and between 250 W and 500 W source power in a 200 mm chamber maintained at 10 to 200 mTorr while the substrate is cooled to between −10° C. and 20° C. In an alternate embodiment, a nitrided region is formed in patterned photoresist 240 using a nitrogen plasma pretreatment, such as ammonia ($NH_3$) or a nitrogen oxide, to form Si—N bonds in the silicon containing photoresist.

In one embodiment of the present invention, the BARC 230 is plasma etched to further define the multi-layered mask 250 at operation 125. In an embodiment, BARC 230 is etched with a conventional halogen-based chemistry, including a gas such as, but not limited to, $CF_4$. Halogen-based chemistries generally achieve a reasonably high etch rate relative to the developed layer, providing an etch selectivity to the organic BARC greater than 4:1. In another embodiment, a halogen-free plasma etch of the BARC 230 is employed. A halogen-free plasma etch of the organic BARC is advantageous for embodiments employing relatively thin BARC layers (on the order of 400 Å) because, as discussed further below, halogen-free BARC etch embodiments of the present invention can be performed simultaneously with the plasma pretreatment 120 discussed above. In one halogen-free embodiment, BARC 230 is etched with an $O_2$ plasma. In a further embodiment, the $O_2$ plasma is energized with bias power between 75 W and 150 W and source power between 200 W and 300 W. Bias power increases the etch rate of BARC 230 relative to the patterned photoresist 240 (pretreated or not), while source power above 300 W increases the lateral etch rate of the BARC layer, resulting in a greater undercut below the patterned photoresist 240. However, for thin BARC layers, a significant amount of BARC undercut can be tolerated because the subsequent amorphous carbon etch, discussed below, is relatively anisotropic such that the sidewall of the amorphous carbon layer 225 will follow the overhanging sidewall of patterned photoresist 240. Thus, neither the line edge roughness (LER) nor the critical dimension control of the amorphous carbon layer 225 is adversely affected by undercutting a BARC 230 that is on the order of 400 Å. Therefore, in one embodiment, the BARC 230 is etched by introducing 25-75 standard cubic centimeters per minute (sccm) of $O_2$ energized with between 75 W and 150 W bias power and between 200 W and 300 W source power in a 200 mm chamber at 5 to 25 mTorr. The substrate is cooled to between −10° C. and 15° C. The duration of this operation is dependent on the thickness of the BARC 230, but, in one embodiment, a 400 Å BARC layer is cleared in less than 15 seconds.

In yet another embodiment, BARC layer undercut can be nearly eliminated with the introduction of both $N_2$ and CO additives to the $O_2$ plasma. Introduction of $N_2$ in conjunction with CO provides significant sidewall protection of the BARC 230 when the ratio of $O_2$ to $N_2$ to CO is approximately 1:1:1. Thus, in an embodiment with BARC 230 significantly thicker than 500 Å, undercut is prevented by introducing 25-75 sccm $O_2$ with 25-75 sccm $N_2$ and 25-100 sccm CO ranging from a 1:1:1 to a 1:1:3 $O_2$:$N_2$:CO gas ratio energized with between 75 W and 150 W bias power and between 200 W and 300 W source power in a 200 mm chamber at 5 to 25 mTorr. Furthermore, it is noted that in alternate embodiments, the $N_2$ source herein described in great detail may be replaced with other nitrogen sources, such as, but not limited to nitrogen oxides (NO, $N_2O$, etc.) or ammonia ($NH_3$).

In a further embodiment of the present invention, employing both BARC 230 and a patterned photoresist 240 containing silicon, the plasma pretreatment of the developed layer is performed simultaneously with the organic BARC etch. In this embodiment, a single plasma exposure combines operations 120 and 125 to produce the structure depicted in FIG. 2C. Because the oxidation of the silicon in the patterned photoresist 240, as discussed above, is impeded by $N_2$ and CO additives, an $O_2$ BARC etch without these additives is advantageous. As noted above, as long as the BARC 230 is not significantly thicker than approximately 500 Å, undercut of the BARC 230 can be tolerated. Non-zero bias power provides increased selectivity of BARC 230 etch to the patterned photoresist 240 as well as increased oxidation of the silicon in the patterned photoresist 240. One embodiment suitable for simultaneously oxidizing the silicon photoresist and etching the BARC 230 introduces 50 sccm $O_2$, energized with a bias power of 100 W and a source power of 250 W at 25 mTorr for approximately 15 seconds while the 200 mm substrate is controlled to between −10° C. and 15° C. A 15 second exposure is sufficient to form the modified photoresist 245 on patterned photoresist 240 and also clear an organic BARC layer approximately 400 A thick.

Figure 2D:
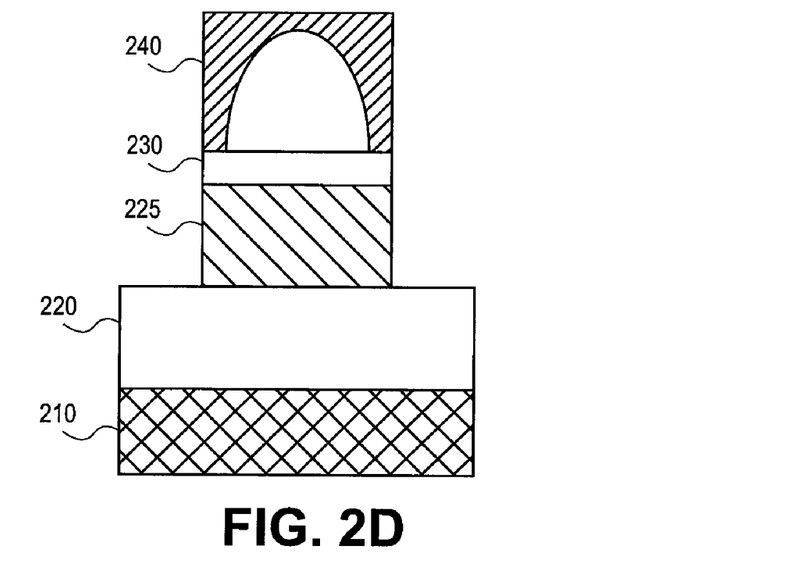

In an embodiment of the present invention, at operation 130, the amorphous carbon layer 225 is etched to complete the definition of the multi-layered mask 250. In a particular embodiment the etch employs a halogen-free chemistry including oxygen ($O_2$), nitrogen ($N_2$), and carbon monoxide (CO) to define the multi-layered mask as shown in FIG. 2D. The halogen-free chemistry has good selective (S) over patterned photoresist 240 and is able to provide a smooth sidewall in the amorphous carbon film 225 with good profile control. The lean chemistry reduces polymer deposition and the LER that can be caused by non-uniform polymer deposition on the feature sidewalls. This also allows the frequency of chamber cleans to be reduced, increasing equipment productivity. In a particular embodiment where an etch chamber is dedicated to etching features in the multi-layered mask, operations 120, 125, and 130 of FIG. 1 can be performed without forming fluorinated polymer on the chamber walls which can cause undesirable "chamber history" effects typical in etch systems. The etch rate of the amorphous carbon layer increases dramatically with increasing $O_2$ and $N_2$ flow. However, as previously discussed in the context of the BARC layer etch above, the selectivity over the patterned photoresist 240, even with oxidized layer 245, decreases when $N_2$ flow is increased. However, the etch profile of the amorphous carbon layer 225 becomes more anisotropic and line CD loss is reduced with the addition of $N_2$. Embodiments employing CO avoid this trade off between photoresist selectivity and loss of line width in the amorphous carbon layer 225. CO addition retards line CD loss in the amorphous carbon layer significantly better than $N_2$. Therefore the selectivity over the patterned photoresist 240 can be improved for a given amount of line CD loss in the amorphous carbon layer 225. However, CO etches amorphous carbon layer 225 more slowly than does $N_2$. Therefore, embodiments employing a mixture of $O_2$, $N_2$ and CO are advantageous.

The $O_2$:$N_2$:CO ratio affects the profile of the amorphous carbon layer 225. For example, in one embodiment, a 1:1:1 gas ratio provides 63 nm line widths with nearly vertical sidewalls and no etch striations in a 2000 Å amorphous carbon layer 225 when a 1400 Å thick patterned photoresist 240 has a 70 nm CD upon lithographic exposure. The $O_2$:CO ratio can be increased to more than 1:1 to narrow the CD of the amorphous carbon line. In one embodiment, a first etch of 1:1:1 $O_2$:$N_2$:CO is employed to clear the amorphous carbon layer 225, followed with a second etch employing a ratio of 1:1:0.5 $O_2$:$N_2$:CO to trim the amorphous carbon layer 225 to a reduced line width while retaining nearly vertical sidewalls in the multi-layered mask. In an embodiment of the present invention, the total gas flow of the $O_2$, $N_2$ and CO mixture is between approximately 75 sccm and 200 sccm at process pressures between 10 mTorr and 200 mTorr. Again, it should be appreciated that this detailed description of the behavior of the $O_2$, $N_2$, CO chemistry is applicable to alternate embodiments employing other nitrogen sources, such as, but not limited to nitrogen oxides (NO, $N_2O$, etc.) or ammonia ($NH_3$).

In an embodiment of the present invention, the amorphous carbon layer 225 is etched with a plasma including $O_2$, $N_2$, and CO which is energized with a bias power between 150 W and 300 W and a source power between 0 W and 200 W for a 200 mm substrate. The amount of source power is dependant on the amount of CO introduced. Increasing the amount of source power can offset the reduction in the etch rate of the amorphous carbon layer 225 when CO is introduced. However, embodiments with source powers below 200 W are advantageous because increasing source power also tends to erode patterned photoresist 240 (even if containing silicon) because of the sputtering effect of the $N_2$ and CO additives. In embodiments with low source power, the amount of CO is constrained so that an appreciable amorphous carbon etch rate is maintained. In a particular embodiment, the amorphous carbon layer 225 is etched by introducing 25-100 sccm of $O_2$, 25-100 sccm of N2 and 25-100 sccm of CO at a ratio between 1:1:1: and 1:1:3 at 25 mTorr and energized with a bias power of 150 W and a source power of 0 W while the 200 mm substrate is held at between 5° C. and 20° C.

The halogen-free amorphous carbon layer etch chemistries of the present invention provide a reasonably high selectivity, greater than 3:1, over a conventional patterned photoresist 240. The $O_2$, $N_2$, CO chemistry of the amorphous carbon layer etch advantageously retains the modified photoresist 245 which, in one embodiment, was first formed in $O_2$ plasma at a higher source power. Modified photoresist 245, formed by oxidizing silicon in the photoresist with a first high source power in operation 120, is able to withstand the $O_2$, $N_2$, CO chemistry energized by a low source power in operation 130. Thus, embodiments employing both the pretreatment of the patterned photoresist 240 and an amorphous carbon etch utilizing $O_2$, $N_2$, CO have very high etch selectivity (S), between 10:1 and 100:1 in favor of the amorphous carbon layer 225.

Figure 2E:
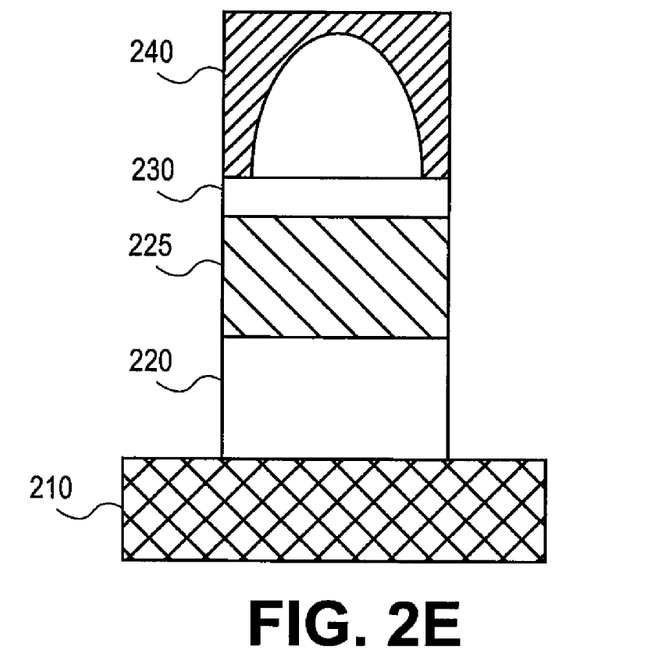
Figure 2F:
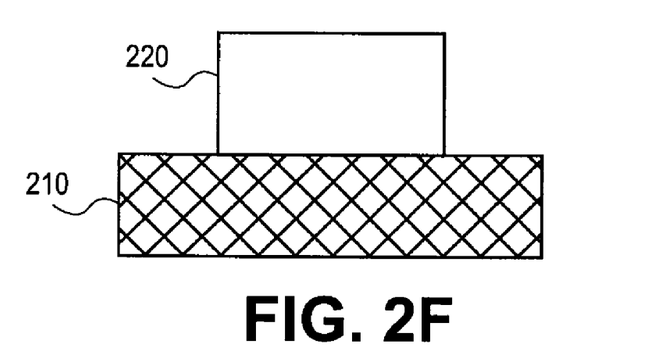

At operation 140, of FIG. 1, the main etch is performed using the multi-layered mask defined by embodiments of the present invention. The main etch uses the multi-layered mask to faithfully transfer a feature into the substrate film 220, as shown in FIG. 2E. Depending on the film, various known etch techniques and chemistries may be employed in the main etch, such as, but not limited to, a fluorine-based plasma etch of a nitride or oxide substrate film. In an embodiment, the substrate film is defined with features below 80 nm using the multi-layered mask. The smooth sidewall of the amorphous carbon layer 225, as formed with $O_2$, $N_2$, CO chemistry, enables the substrate film 220 to be etch with reduced line edge roughness (LER) and achieve a sub-80 nm feature with high fidelity.

Finally, at operation 150, an ash or stripping process is used to remove every layer of the multi-layered mask and conclude method 100 of FIG. 1. In one embodiment, an in-situ ash process is performed in the same etch chamber utilized for operations 120, 125, 130, and 140. In a further embodiment, a high flow of $O_2$ is energized with a source power of at least 300 W while the bias power is less than 150 W. The high source power will erode the patterned photoresist 240, even if containing silicon, as well as the BARC and amorphous carbon layers, 230 and 225. The in-situ ash also prepares the chamber to repeat method 100 on a subsequent substrate.

In an embodiment, the plasma etch processes of method 100 are performed in a magnetically enhanced reactive ion etcher (MERIE) etch chamber, such as the MxP®, MXP+™, Super-E™ or E-MAX® chamber manufactured by Applied Materials of CA, USA. Other types of high performance etch chambers known in the art may also be used, for example, chambers in which a plasma is formed using microwave or electron cyclotron resonance (ECR) techniques. A cross-sectional view of an exemplary dual frequency MERIE system 300 is shown in FIG. 3. System 300 includes a grounded chamber 305. In one exemplary system, chamber 305 has a volume of approximately 25 liters. A substrate 310 is loaded through an opening 315 and clamped to a temperature controlled cathode 320. Process gases, are supplied from gas sources 346, 347 and 348 through respective mass flow controllers 349 to the interior of the chamber 305. Chamber 305 is evacuated to between 5 mTorr and 500 mTorr via an exhaust valve 350 connected to a high capacity vacuum pump stack 355 including a turbo molecular pump.

When RF power is applied, a plasma is formed in chamber processing region 360. Magnetic coils 340 surround chamber 305 to provide a rotating magnetic field of between 0 G and 100 G to control the density of the plasma. Bias RF generator 325 is coupled to cathode 320. Bias RF generator 325 provides bias power to energize the plasma. Bias RF generator 325 typically has a frequency between about 4 MHz to 60 MHz, and in a particular embodiment, is 13.56 MHz. Source RF generator 330 is coupled to a plasma generating element 335 which is anodic relative to cathode 320 to provide source power to energize the plasma. Source RF generator 330 typically has a higher frequency than the bias RF generator 325, such as between 40 and 180 MHz, and in a particular embodiment, is 60 MHz. Bias power affects the bias voltage on substrate 310, controlling ion bombardment of the substrate 310, while source power affects the plasma density relatively independently of the bias on substrate 310. It is noted that the etch performance of a given set of input gases from which the plasma is generated varies significantly with a plasma density and wafer bias, thus both the amount and source of power energizing the plasma are important. Because substrate diameters have progressed over time, from 150 mm, 200 mm, 300 mm, etc., it is common in the art to normalize the source and bias power of a plasma etch system to the substrate area. Throughout this specification, references to watts (W) should be considered in the context of a system designed to accommodate a 200 mm diameter round substrate and therefore all powers may be scaled to an appropriate substrate size.

In an embodiment of the present invention, system 300 is computer controlled by controller 370 to control the bias power, source power, magnetic field strength, gas flows, pressure, cathode temperature, as well as other process parameters. Controller 370 may be one of any form of general-purpose data processing system that can be used in an industrial setting for controlling the various subprocessors and subcontrollers. Generally, controller 370 includes a central processing unit (CPU) 372 in communication with memory 373 and input/output (I/O) circuitry 374, among other common components. Software commands executed by CPU 372, cause system 300 to, for example, oxidize silicon moieties in photoresist layers, etch BARC layers, etch amorphous carbon layers with $O_2$, $N_2$ and CO, as wells as perform other processes in accordance with the present invention. Portions of the present invention may be provided as a computer program product, which may include a computer-readable medium having stored thereon instructions, which may be used to program a computer (or other electronic devices) to oxidize silicon moieties in photoresist layers, etch BARC layers, etch amorphous carbon layers with $O_2$, $N_2$ and CO, as wells as perform other processes in accordance with the present invention. The computer-readable medium may include, but is not limited to, floppy diskettes, optical disks, CD-ROMs (compact disk read-only memory), and magnetooptical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable medium suitable for storing electronic instructions. Moreover, the present invention may also be downloaded as a computer program product, wherein the program may be transferred from a remote computer to a requesting computer.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method of etching a feature in a multi-layer mask, comprising:
   providing a substrate with a multi-layer mask including a patterned photoresist layer and an amorphous carbon layer, the amorphous carbon layer unpatterned;
   etching at least a portion of a thickness of the amorphous carbon layer with a plasma comprising $O_2$, $N_2$, and CO to pattern the amorphous carbon layer based on the photoresist layer pattern.

2. The method of claim 1, wherein the plasma comprising $O_2$, $N_2$, and CO is energized with a source power of less than 75 W and a bias power of at least 150 W normalized to a 200 mm substrate.

3. The method of claim 1, wherein the $O_2$:$N_2$:CO gas ratio is between 1:1:1 and 1:1:3.

4. The method of claim 1, wherein the flow of $O_2$ is between 15 and 50 sccm.

5. The method of claim 1, wherein the thickness of the amorphous carbon layer is etched through with the plasma.

6. The method of claim 1, further comprising:
   pretreating the patterned photoresist layer with a plasma comprising $O_2$ prior to etching the amorphous carbon layer to oxidize silicon contained in the patterned photoresist layer.

7. The method of claim 6, wherein the plasma is energized with a bias power less than 150 W normalized to a 200 mm substrate.

8. The method of claim 7, wherein the plasma is energized with a source power between 200 W and 400 W normalized to a 200 mm substrate.

9. The method of claim 8, wherein the patterned photoresist layer is pretreated for between 5 and 25 seconds.

10. A method of etching a feature in a multi-layer mask, comprising:
    providing a substrate with a multi-layer mask including a patterned photoresist layer over an amorphous carbon layer and separated by an organic anti-reflective coating, wherein the patterned photoresist layer contains silicon;
    pretreating the patterned photoresist layer with a plasma comprising $O_2$ energized with a first bias power and a first source power to oxidize silicon in the patterned photoresist layer;
    etching at least a portion of a thickness of the amorphous carbon layer with a plasma comprising $O_2$, $N_2$, CO to pattern the amorphous carbon layer based on the photoresist layer pattern, wherein the plasma is energized with a second bias power and a second source power, and wherein the second source power is lower than the first source power.

11. The method of claim 10 further comprising:
    etching through the organic anti-reflective coating during the pretreatment of the patterned photoresist layer.

12. The method of claim 10, wherein the first bias power is less than 150 W and the first source power is between 200 W and 400 W normalized to a 200 mm substrate.

13. The method of claim 10, wherein the second bias power is at least 200 W normalized to a 200 mm substrate.

14. The method of claim 10, wherein the first source power is greater than the second source power.

15. The method of claim 14, wherein the second source power is 0 W.

16. The method of claim 10, further comprising:
    etching a dielectric film with a plasma comprising a halogen; and
    ashing a substantial portion of the multi-layer mask with a plasma comprising $O_2$ energized with a third bias power and a third source power.

17. The method of claim 16, wherein the third bias power is less than 150 W and the third source power at least 300 W, normalized to a 200 mm substrate.

* * * * *